(12) United States Patent
Hishinuma et al.

(10) Patent No.: US 12,328,994 B2
(45) Date of Patent: Jun. 10, 2025

(54) ELECTRONIC DEVICE

(71) Applicant: Japan Display Inc., Tokyo (JP)

(72) Inventors: Masatomo Hishinuma, Tokyo (JP); Hiroumi Kinjo, Tokyo (JP); Hayata Aoki, Tokyo (JP)

(73) Assignee: Japan Display Inc., Tokyo (JP)

( * ) Notice: Subject to any disclaimer, the term of this patent is extended or adjusted under 35 U.S.C. 154(b) by 410 days.

(21) Appl. No.: 17/804,339

(22) Filed: May 27, 2022

(65) Prior Publication Data

US 2022/0384749 A1     Dec. 1, 2022

(30) Foreign Application Priority Data

May 31, 2021   (JP) ................................ 2021-091328

(51) Int. Cl.

| | |
|---|---|
| *H10K 59/124* | (2023.01) |
| *H10K 50/844* | (2023.01) |
| *H10K 71/00* | (2023.01) |
| *H10K 77/10* | (2023.01) |
| *H10K 102/00* | (2023.01) |

(52) U.S. Cl.
CPC ......... *H10K 59/124* (2023.02); *H10K 50/844* (2023.02); *H10K 71/00* (2023.02); *H10K 77/111* (2023.02); *H10K 2102/311* (2023.02)

(58) Field of Classification Search
CPC .... H10K 50/844; H10K 59/121; H10K 71/00; H10K 77/111; H10K 2102/311
See application file for complete search history.

(56) References Cited

U.S. PATENT DOCUMENTS

2014/0131683 A1*   5/2014   Kim ..................... H10K 50/844
                                                                          438/22
2014/0183479 A1*   7/2014   Park ....................... H10K 71/00
                                                                          438/34

(Continued)

FOREIGN PATENT DOCUMENTS

| JP | 2000-195677 A | 7/2000 |
|---|---|---|
| JP | 2008-135325 A | 6/2008 |

(Continued)

OTHER PUBLICATIONS

Office Action issued on Jan. 28, 2025, in corresponding Japanese Application No. 2021-091328, 6 pages.

(Continued)

*Primary Examiner* — Fernando L Toledo
*Assistant Examiner* — Ryan T. Fortin
(74) *Attorney, Agent, or Firm* — Maier & Maier, PLLC

(57) ABSTRACT

An electronic device includes an insulating base including a strip-shaped portion having elasticity and an island-shaped portion connected to the strip-shaped portion, an organic insulating film disposed on the insulating base, an inorganic insulating film disposed on the organic insulating film, a wiring disposed between the strip-shaped portion and the organic insulating film, an electrical element disposed on the inorganic insulating film and electrically connected to the wiring, in the island-shaped portion, a barrier wall overlapping the island-shaped portion and the strip-shaped portion and surrounding the electrical element, and a sealing film covering the electrical element.

9 Claims, 12 Drawing Sheets

(56) References Cited

U.S. PATENT DOCUMENTS

| | | | |
|---|---|---|---|
| 2016/0149156 A1* | 5/2016 | Kim | H10K 59/80522 |
| | | | 438/46 |
| 2016/0351636 A1* | 12/2016 | Lee | H10K 59/80516 |
| 2019/0058160 A1 | 2/2019 | Kishimoto | |
| 2019/0131365 A1* | 5/2019 | Jung | H10K 50/824 |
| 2019/0189731 A1 | 6/2019 | Managaki | |
| 2021/0098553 A1 | 4/2021 | Yamanaka et al. | |
| 2021/0119175 A1* | 4/2021 | Harikrishna Mohan | |
| | | | H10K 50/844 |
| 2021/0336203 A1* | 10/2021 | Sun | H10K 50/844 |

FOREIGN PATENT DOCUMENTS

| | | | |
|---|---|---|---|
| JP | 2012084357 A | | 4/2012 |
| JP | 2017-113088 A | | 6/2017 |
| JP | 2017123238 A | | 7/2017 |
| JP | 2018174128 A | | 11/2018 |
| JP | 2019110038 A | | 7/2019 |
| JP | 2020-188118 A | * | 11/2020 |
| JP | 2020-202208 A | * | 12/2020 |
| JP | 2021082614 A | | 5/2021 |
| WO | 2020202274 A1 | | 10/2020 |
| WO | 2020246142 A1 | | 12/2020 |

OTHER PUBLICATIONS

Office Action issued on Feb. 28, 2025, in corresponding Chinese Application No. 202210598248.7, 14 pages.

Office Action issued on Mar. 25, 2025, in corresponding Indian Application No. 202214030534, 6 pages.

* cited by examiner

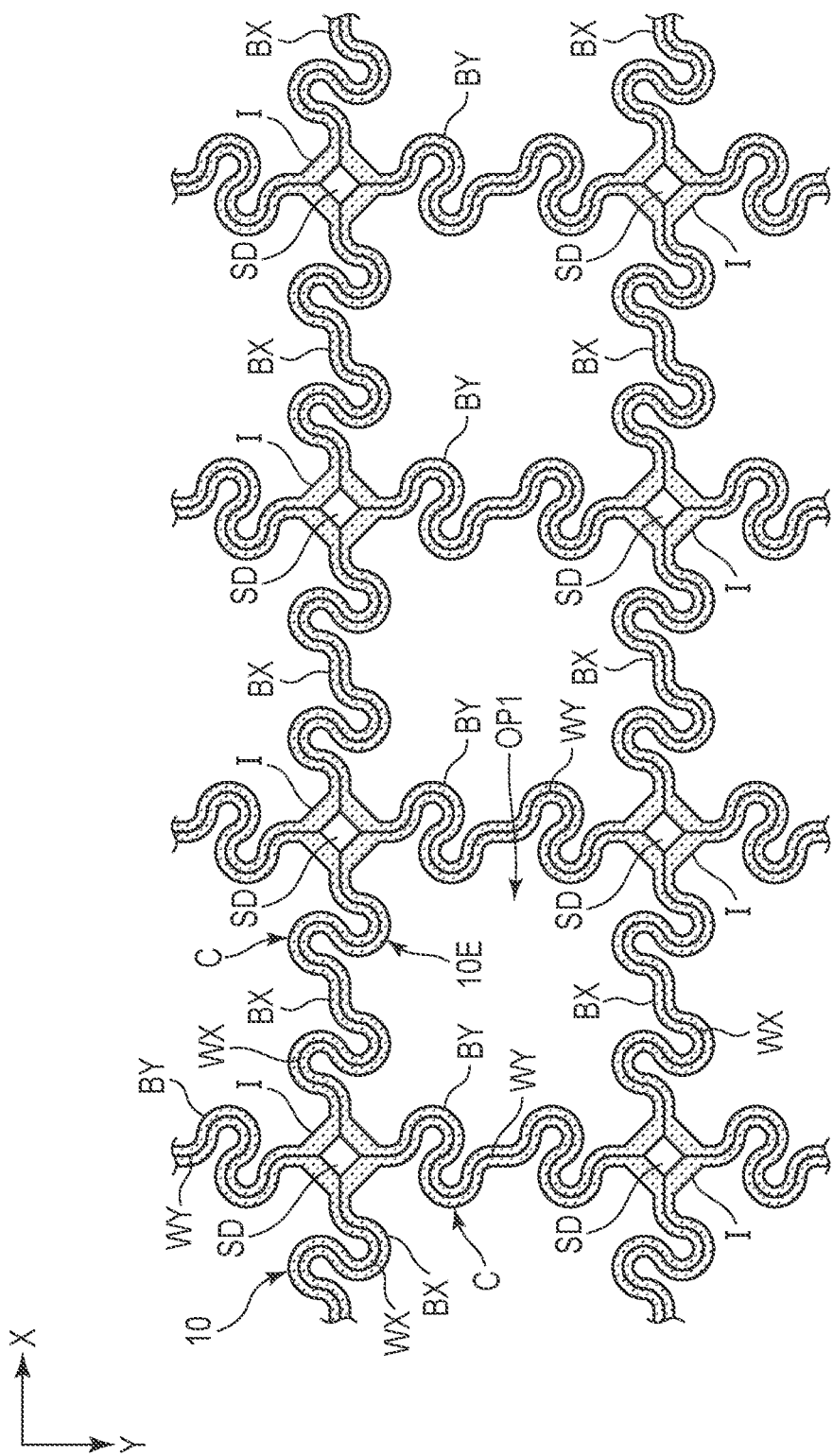
F I G. 2

ELECTRONIC DEVICE

CROSS-REFERENCE TO RELATED APPLICATIONS

This application is based upon and claims the benefit of priority from Japanese Patent Application No. 2021-091328, filed May 31, 2021, the entire contents of which are incorporated herein by reference.

FIELD

Embodiments described herein relate generally to an electronic device.

BACKGROUND

In recent years, the use of flexible substrates having flexibility and elasticity has been studied in various fields. For example, attachment of a flexible substrate with electrical elements arrayed in a matrix, to a curved surface of a housing of an electronic device, a human body, or the like has been considered. For example, various sensors such as touch sensors and temperature sensors, and display elements can be applied as electrical elements.

In a flexible substrate, it is necessary to take measures to prevent the wirings from being damaged by stress caused by bending and stretching. For example, designing the wirings in a meandering shape has been proposed as such a measure.

In contrast, a technology of dividing an organic layer and a cathode (second electrode) using a pixel division structure is known.

BRIEF DESCRIPTION OF THE DRAWINGS

FIG. 2 is a plan view showing an example of the flexible substrate 2.

DETAILED DESCRIPTION

Figure 1:
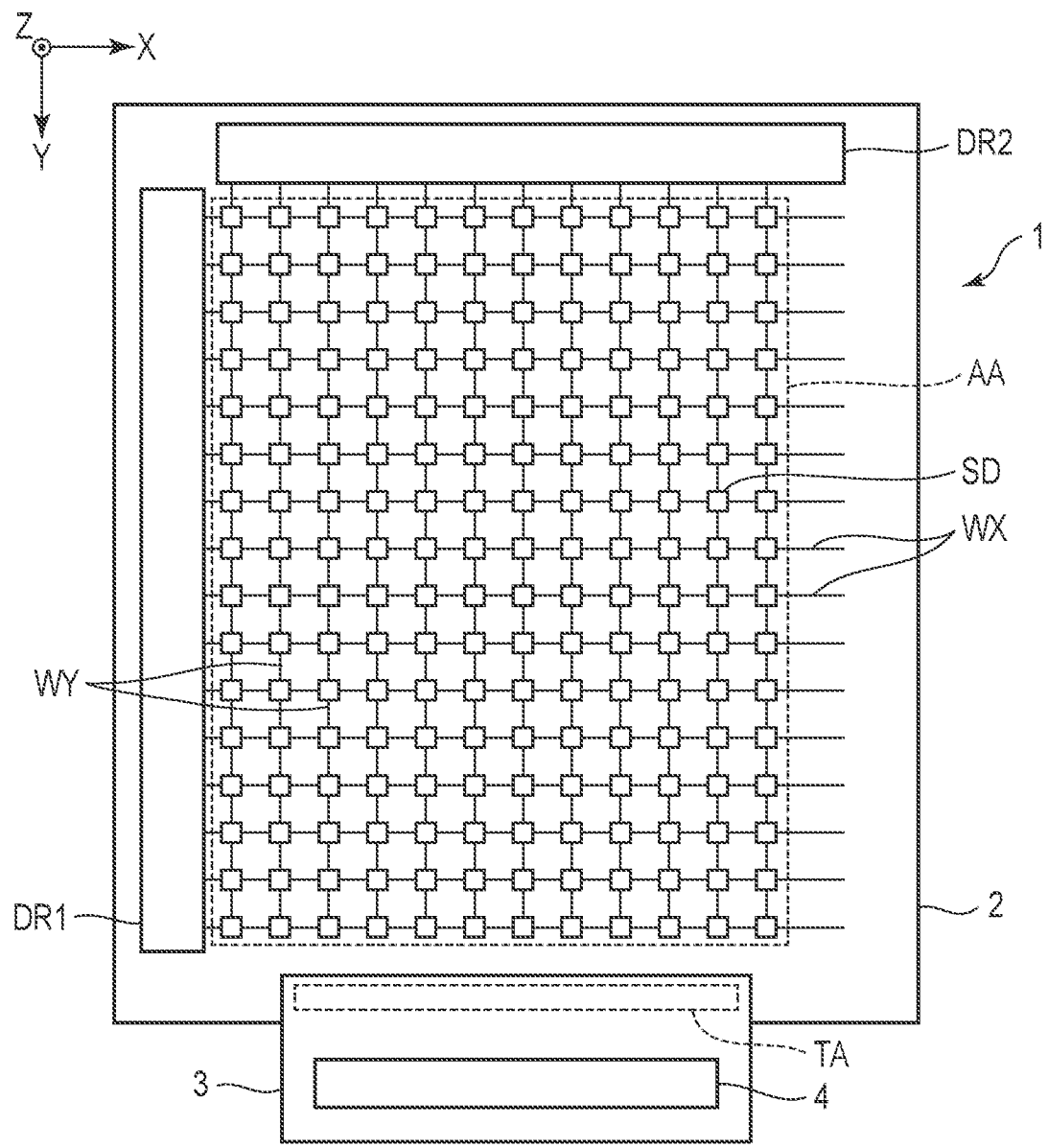
FIG. 1 is a plan view schematically showing an electronic device 1 according to embodiments.

In general, according to one embodiment, an electronic device includes an insulating base including a strip-shaped portion having elasticity and an island-shaped portion connected to the strip-shaped portion, an organic insulating film disposed on the insulating base, an inorganic insulating film disposed on the organic insulating film, a wiring disposed between the strip-shaped portion and the organic insulating film, an electrical element disposed on the inorganic insulating film and electrically connected to the wiring, in the island-shaped portion, a barrier wall overlapping the island-shaped portion and the strip-shaped portion and surrounding the electrical element, and a sealing film covering the electrical element.

According to another embodiment, an electronic device includes an insulating base formed of a resin material, an organic insulating film disposed on the insulating base, an inorganic insulating film disposed on the organic insulating film, a wiring disposed between the insulating base and the organic insulating film, an electrical element disposed on the inorganic insulating film and electrically connected to the wiring, a barrier wall disposed on the inorganic insulating film and surrounding the electrical element, and a sealing film covering the electrical element. The barrier wall includes a first layer which is formed of a metal material and which is in contact with the inorganic insulating film, and a second layer formed of an inorganic insulating material which is the same as a material of the sealing film and stacked on the first layer. The second layer extends toward the electrical element and is in contact with the sealing film.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

FIG. 1 is a plan view schematically showing an electronic device 1 according to the embodiments. In the embodiments, a first direction X, a second direction Y, and a third direction Z are defined as illustrated in the figure. The first direction X, the second direction Y, and the third direction Z are orthogonal to each other, but may cross each other at an angle other than 90 degrees. The first direction X and the second direction Y correspond to, for example, directions parallel to a main surface of the electronic device 1, and the third direction Z corresponds to a thickness direction of the electronic device 1. In the embodiments, viewing an X-Y plane defined by the first direction X and the second direction Y is referred to as planar view.

The electronic device 1 comprises a flexible substrate 2, a circuit board 3, and a controller 4. The circuit board 3 is, for example, a flexible printed circuit board and is electrically connected to each terminal in a terminal area TA of the flexible substrate 2. The controller 4 is mounted on the circuit board 3, but may be mounted directly on the flexible substrate 2.

The flexible substrate 2 is configured to be flexible and stretchable as a whole in at least an effective area AA. The flexible substrate 2 comprises a first driver DR1, a second driver DR2, X wirings WX, Y wirings WY, electrical elements SD, and the like.

The first driver DR1 and the second driver DR2 are disposed on, for example, the flexible substrate 2, but may be disposed on the circuit board 3, the controller 4 or the other substrate. In the example shown in FIG. 1, the first driver DR1 and the second driver DR2 are disposed in an area outside the effective area AA. The area where the first driver DR1 and the second driver DR2 are disposed may be an area having flexibility and elasticity similarly to the effective area AA or a rigid area.

The X wirings WX are generic names of wirings extending substantially along the first direction X, and at least several X wirings WX are electrically connected to the first driver DR1. A plurality of X wirings WX are arranged in the second direction Y. The Y wirings WY are generic names of wirings extending substantially along the second direction Y, and at least several Y wirings WY are electrically connected to the second driver DR2. A plurality of Y wirings WY are arranged in the first direction X. These X wirings WX and the Y wirings WY include a plurality of types of wirings such as scanning lines, signal lines, power lines, and various control lines.

A plurality of sensor elements SD are arrayed in a matrix in the first direction X and the second direction Y and each of them is electrically connected to the X wirings WX and the Y wirings WY, in the effective area AA.

The electrical elements SD are, for example, sensors, semiconductor devices, actuators or the like. As the sensors, for example, optical sensors that receive visible light or near-infrared light, temperature sensors, pressure sensors, touch sensors or the like can be applied. For example, as semiconductor elements, light emitting elements, light receiving elements, diodes, or transistors can be applied. The electrical elements SD are not limited to those exemplified here, and other elements comprising various functions can also be applied. In addition, the electrical elements SD may also be capacitors, resistors, or the like.

When the electrical elements SD are light emitting elements, a flexible display having flexibility and elasticity can be realized. The light emitting element may be, for example, a micro-light emitting diode (LED) with the longest side having a length of 100 μm or less or a mini-LED with the longest side having a length of more than 100 μm and smaller than 300 μm or an LED with the longest side having a length of 300 μm or more. The light emitting element may be an element other than the LED.

For example, the electrical element SD is an organic photodiode comprising an organic photoelectric conversion layer, which is a type of sensor. Alternatively, the electrical element SD is an organic light emitting diode (organic electroluminescent device) comprising an organic light emitting layer, which is a type of light emitting element.

The flexible substrate 2 comprises an insulating base 10 which will be described later. For example, all of the first driver DR1, the second driver DR2, the X wirings WX, the Y wirings WY, and the electrical elements SD are disposed on the insulating base 10.

FIG. 2 is a plan view showing an example of the flexible substrate 2.

The insulating base 10 is stretchable. In this case, being stretchable indicates a property of expanding and contracting, i.e., a property of expanding in a non-expanding state that is a normal state and restoring when released in the expanding state. The non-expanding state indicates a state in which a tensile stress is not added.

The insulating base 10 is formed in, for example, a mesh form. In other words, the insulating base 10 includes a plurality of strip-shaped portions BX formed substantially along the first direction X, a plurality of strip-shaped portions BY formed substantially along the second direction Y, and a plurality of island-shaped portions I. The plurality of strip-shaped portions BX are arranged in the second direction Y, and the plurality of strip-shaped portions BY are arranged in the first direction X. Each of the strip-shaped portions BX and BY is stretchable. For example, each of the strip-shaped sections BX and BY meanders. The other form of the stretchable strip-shaped portions BX and BY may be linearly strip-shaped portions formed by applying stretchable materials such as silver nanowires or carbon nanotubes. In addition, the strip-shaped portions BX and BY meander not only in the X-Y plane, but also in the X-Z plane or the Y-Z plane.

The island-shaped portions I correspond to intersections of the strip-shaped portions BX and the strip-shaped portions BY.

The plurality of island-shaped portions I are arrayed in a matrix in the first direction X and the second direction Y. The island-shaped portions I adjacent in the first direction X are connected by the strip-shaped portion BX, and the island-shaped portions I adjacent in the second direction Y are connected by the strip-shaped portion BY. A plurality of strip-shaped portions BX and a plurality of strip-shaped portions BY are connected to one island-shaped portion I. The island-shaped portions I may be shaped in a quadrangle such as a square, a rectangle or a rhombus, or another polygon, or another shape such as a circle or an ellipse. The strip-shaped portions BX and BY may be connected to corners of the island-shaped portions I or sides of the island-shaped portions I.

In other words, the insulating base 10 includes a plurality of first openings (through holes) OP1. The plurality of first openings OP1 are arrayed in a matrix in the first direction X and the second direction Y. Each of the first openings OP1 is surrounded by an outer edge 10E of the insulating base 10 in planar view. Alternatively, one first opening OP1 is surrounded by two strip-shaped portions BX adjacent to each other in the second direction Y and two strip-shaped portions BY adjacent to each other in the first direction X.

The strip-shaped portion BY is located between the two first openings OP1 adjacent to each other in the first direction X. The strip-shaped portion BX is located between the two first openings OP1 adjacent to each other in the second direction Y. The shape of each of the first openings OP1 is substantially the same.

Each of the strip-shaped portions BX and BY includes one or more curved portions C. Such a shape is often referred to as a meander pattern. However, the shapes of the strip-shaped portions BX and BY are not limited to the example in FIG. 2. The shapes of the strip-shaped portions BX and BY may be the same as each other or different from each other.

The insulating base 10 is formed of, for example, polyimide. The material of the insulating base 10 is not limited to polyimide, but other resin materials can also be used as the material.

The X wirings WX are disposed on the strip-shaped portions BX and meander similarly to the strip-shaped portions BX. The Y wirings WY are disposed on the strip-shaped portions BY and meander similarly to the strip-shaped portions BY.

The electrical elements SD are disposed on the island-shaped portions I and electrically connected to the X wirings WX and the Y wirings WY. For example, one electrical element SD is disposed on one island-shaped portion I, but a plurality of electrical elements SD may be disposed on one island-shaped portion I.

Figure 3:
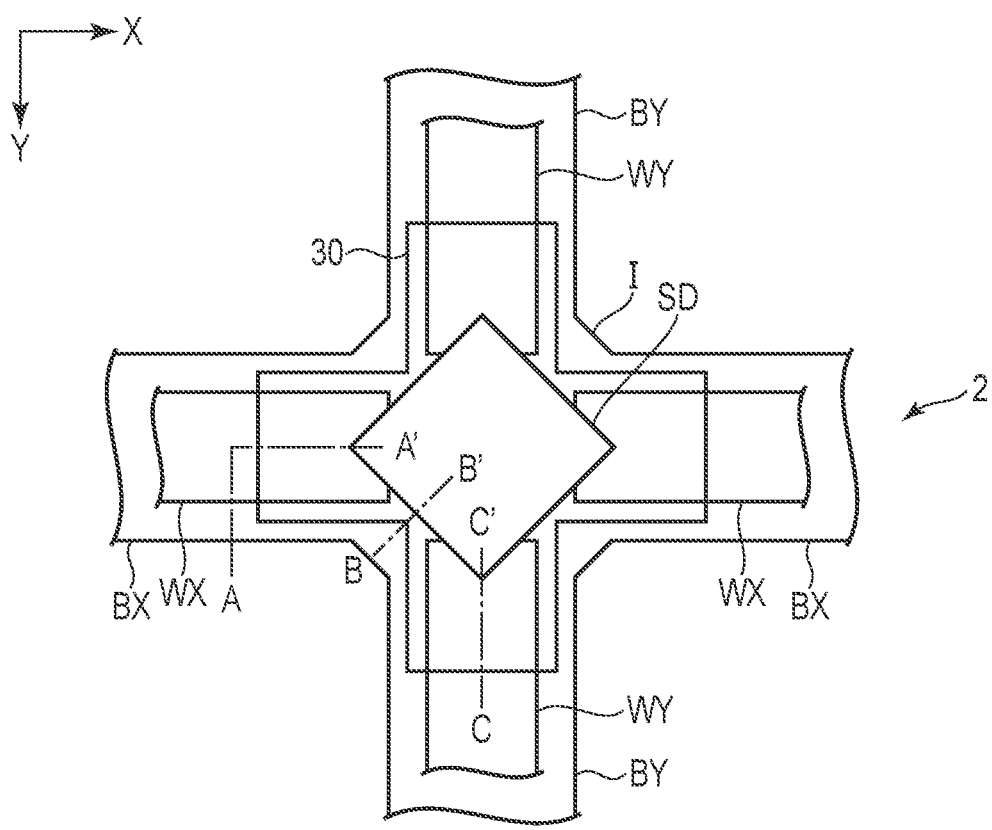
FIG. 3 is an enlarged plan view showing one island-shaped portion I.

FIG. 3 is an enlarged plan view showing one island-shaped portion I.

Two strip-shaped portions BX and two strip-shaped portions BY are connected to the island-shaped portion I. In other words, the island-shaped portion I is located between the strip-shaped portions BX in the first direction X and located between the strip-shaped portions BY in the second direction Y.

In planar view, the barrier wall 30 overlaps the island-shaped portion I and surrounds the electrical element SD located in the island-shaped portion I. In addition, the barrier wall 30 overlaps each of the strip-shaped portions BX and BY, and overlaps the X wirings WX and the Y wirings WY. In the example illustrated, the barrier wall 30 is formed to surround a cross-shaped area including the area where the electrical element SD is disposed.

Figure 4:
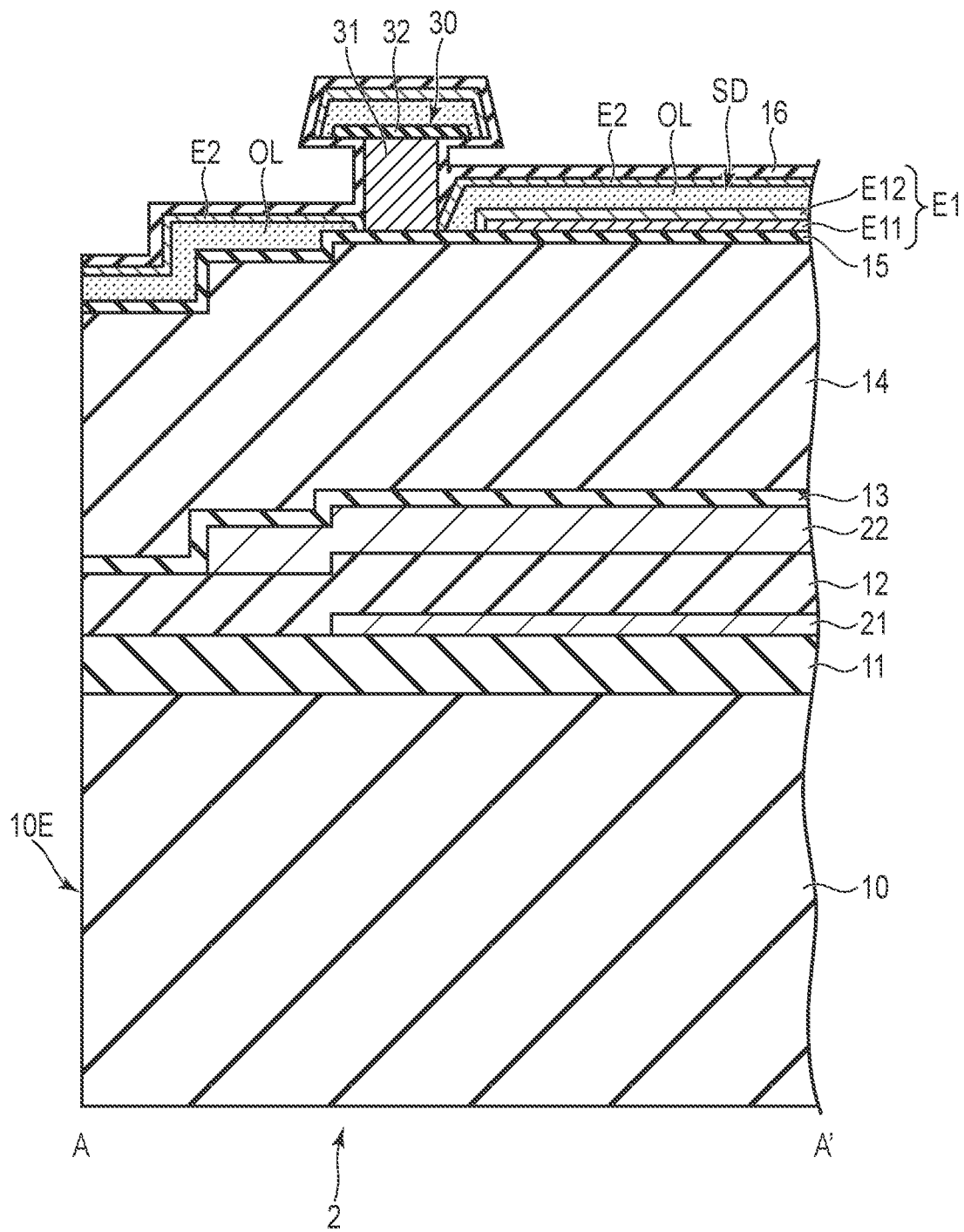
FIG. 4 is a cross-sectional view showing the flexible substrate 2 including the island-shaped portion I shown in FIG. 3 as viewed along line A-A'.
Figure 5:
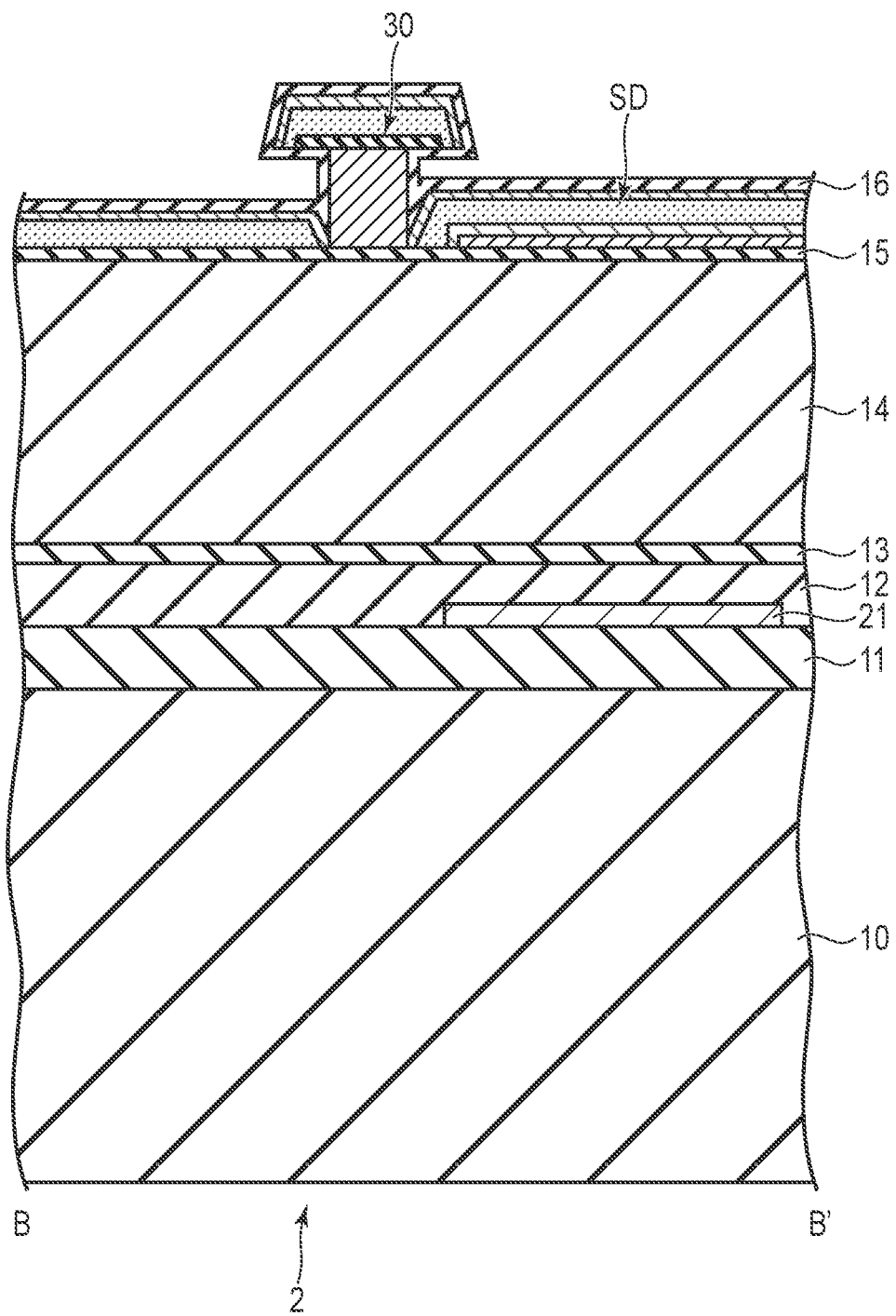
FIG. 5 is a cross-sectional view showing the flexible substrate 2 including the island-shaped portion I shown in FIG. 3 as viewed along line B-B'.
Figure 6:
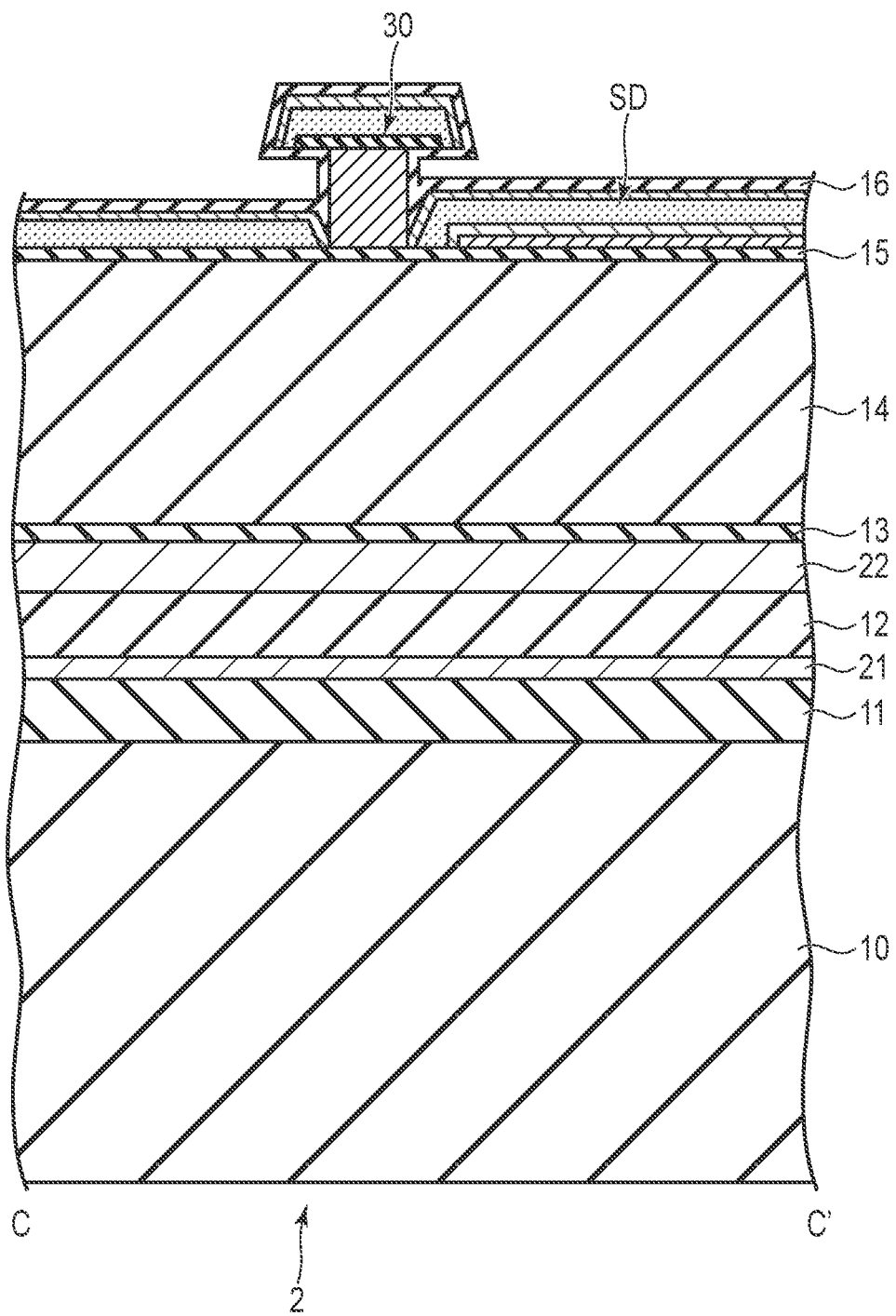
FIG. 6 is a cross-sectional view showing the flexible substrate 2 including the island-shaped portion I shown in FIG. 3 as viewed along line C-C'.

FIG. 4 is a cross-sectional view showing the flexible substrate 2 including the island-shaped portion I shown in FIG. 3 as viewed along line A-A'. FIG. 5 is a cross-sectional view showing the flexible substrate 2 including the island-shaped portion I shown in FIG. 3 as viewed along line B-B'. FIG. 6 is a cross-sectional view showing the flexible substrate 2 including the island-shaped portion I shown in FIG. 3 as viewed along line C-C'.

The flexible substrate 2 comprises the insulating base 10, an inorganic insulating film 11, a wiring layer 21, an inorganic insulating film 12, a wiring layer 22, an inorganic insulating film 13, an organic insulating film 14, an inorganic insulating film 15, an electrical element SD, a sealing film 16, and a barrier wall 30.

The entire flexible substrate 2 may be covered with a protective film having elasticity. Although illustration of the protective film is omitted, a back of the insulating base 10 and a surface of the sealing film 16 may be covered with the protective film.

The inorganic insulating film 11 is disposed on the insulating base 10 and extends over the island-shaped portion I, the strip-shaped portions BX, and the strip-shaped portions BY. The wiring layer 21 is disposed on the inorganic insulating film 11. The inorganic insulating film 12 is disposed on the wiring layer 21 and the inorganic insulating film 11. The wiring layer 22 is disposed on the inorganic insulating film 12. The inorganic insulating film 13 is disposed on the wiring layer 22 and the inorganic insulating film 12. The organic insulating film 14 is disposed on the inorganic insulating film 13. The inorganic insulating film 15 is disposed on the organic insulating film 14. The inorganic insulating film 12, the inorganic insulating film 13, the organic insulating film 14, and the inorganic insulating film 15 extend over the island-shaped portion I, the strip-shaped portions BX, and the strip-shaped portions BY, similarly to the inorganic insulating film 11.

Each of the inorganic insulating films 11 and 12 is formed as a multilayer body in which a plurality of insulating layers are stacked. For example, each of the inorganic insulating films 11 and 12 includes an insulating layer formed of silicon nitride and an insulating layer formed of silicon oxide. Each of the inorganic insulating films 11 and 12 may be formed as a single-layer body or a multilayer body.

The inorganic insulating film 13 is, for example, an insulating layer formed as a single-layer body and formed of silicon oxide. The inorganic insulating film 13 may be an insulating layer formed of silicon nitride as another single-layer body or may be formed as a multilayer body of a plurality of insulating layers.

The inorganic insulating film 15 is, for example, an insulating layer formed as a single-layer body and formed of silicon nitride, aluminum oxide or the like. Such an inorganic insulating film 15 prevents moisture from penetrating into the organic insulating film 14 or the moisture contained in the organic insulating film 14 from diffusing into the electric elements SD. The inorganic insulating film 15 may be formed as a multilayer body of a plurality of insulating layers.

The wiring layer 21 is electrically connected to either of the X wirings WX and the Y wirings WY shown in FIG. 2 or the like. The second wiring layer 22 is electrically connected to the others of the X wirings WX and the Y wirings WY. For example, the wiring layer 21 located in the strip-shaped portion BX is the X wiring WX, the wiring layer 21 located in the island-shaped portion I is a wiring or electrode electrically connected to the X wiring WX, the wiring layer 22 located in the strip-shaped portion BY is the Y wiring WX, and the wiring layer 22 located in the island-shaped portion I is a wiring or electrode electrically connected to the Y wiring WY In other words, the X wiring WX is located between the strip-shaped portion BX and the organic insulating film 14, the Y wiring WY is located between the strip-shaped portion BY and the organic insulating film 14.

The wiring layers 21 and 22 are formed of metallic materials such as molybdenum, tungsten, titanium, and aluminum.

The barrier wall 30 comprises a first layer 31 which is in contact with the inorganic insulating film 15, and a second layer 32 stacked on the first layer 31. The first layer 31 is formed of a different material as the second layer 32. For example, the first layer 31 is formed of a metallic material, but may be formed of an insulating material. The second layer 32 is formed of an insulating material, but may be formed of a metallic material. Details of the barrier wall 30 will be described later.

The electrical element SD is disposed on the inorganic insulating film 15 in the island-shaped portion I. The electrical element SD comprises a lower electrode E1, an upper electrode E2, and an organic layer OL. For example, when the electrical element SD is an organic photodiode comprising an organic photoelectric conversion layer as the organic layer OL, one of the lower electrode E1 and the upper electrode E2 functions as an anode of the electrical element SD, and the other of the lower electrode E1 and the upper electrode E2 functions as a cathode of the electrical element SD.

The lower electrode E1 is disposed on the inorganic insulating film 15 and is in contact with the inorganic insulating film 15. The lower electrode E1 is patterned for each electrical element SD (or each island-shaped portion I). The lower electrode E1 is separated from the barrier wall 30.

Such a lower electrode E1 is formed of, for example, a transparent conductive material such as indium tin oxide or indium zinc oxide, or a metallic material such as silver, titanium, or aluminum. The lower electrode E1 may be formed as a single-layer body of a transparent conductive material, a single-layer body of a metallic material, or a multilayer body. In the example illustrated, the lower electrode E1 is formed as a multilayer body of a metal layer E11 formed of a metallic material and a transparent conductive layer E12 formed of a transparent conductive material, and the transparent conductive layer E12 covers the metal layer E11.

The organic layer OL is disposed on the lower electrode E1 and is in contact with the lower electrode E1. In addition, the organic layer OL extends to the outside of the lower electrode E1, and is disposed on the inorganic insulating film 15 between the barrier wall 30 and the lower electrode E1 and is in contact with the inorganic insulating film 15. In addition to an active layer, the organic layer OL may include a hole transport layer, an electron transport layer, and the like.

The upper electrode E2 is disposed on the organic layer OL and is in contact with the organic layer OL. In addition, the upper electrode E2 is in contact with the first layer 31 of the barrier wall 30. The upper electrode E2 is formed of, for example, a transparent conductive material such as indium tin oxide or indium zinc oxide. When the first layer 31 is a conductive layer formed of a metallic material, the upper electrode E2 is in contact with the first layer 31, and the upper electrode E2 and the barrier wall 30 are thereby electrically connected.

The organic layer OL and the upper electrode E2 extend not only to the electrical element SD, but also to the outside of the area surrounded by the barrier wall 30. In other words, the lower electrode E1 of the electrical element SD is disposed in the island-shaped portion I and surrounded by the barrier wall 30, but the organic layer OL and the upper electrode E2 extend not only to the island-shaped portion I, but also to the strip-shaped portions BX and BY outside the barrier wall 30.

In addition, the upper electrode E2 is also in contact with the first layer 31 outside the barrier wall 30. Thus, when the first layer 31 is a conductive layer, the upper electrode E2 shown in the figure is electrically connected to the upper electrodes E2 of the other electrical elements SD located in the adjacent island-shaped portions I. In other words, the upper electrode E2 is a common electrode disposed across a plurality of electrical elements SD.

The sealing film 16 covers the electrical element SD. In addition, the sealing film 16 also covers the barrier wall 30. In the example illustrated, the sealing film 16 is in contact with both the first layer 31 and the second layer 32 of the barrier wall 30.

The sealing film 16 is an inorganic insulating film and is, for example, an insulating layer formed of an inorganic insulating material such as silicon nitride or aluminum oxide. For example, the sealing film 16 is formed of the same material as the second layer 32. For this reason, the degree of close contact between the second layer 32 and the sealing film 16 is made higher and a high sealing performance can be achieved.

Figure 7:
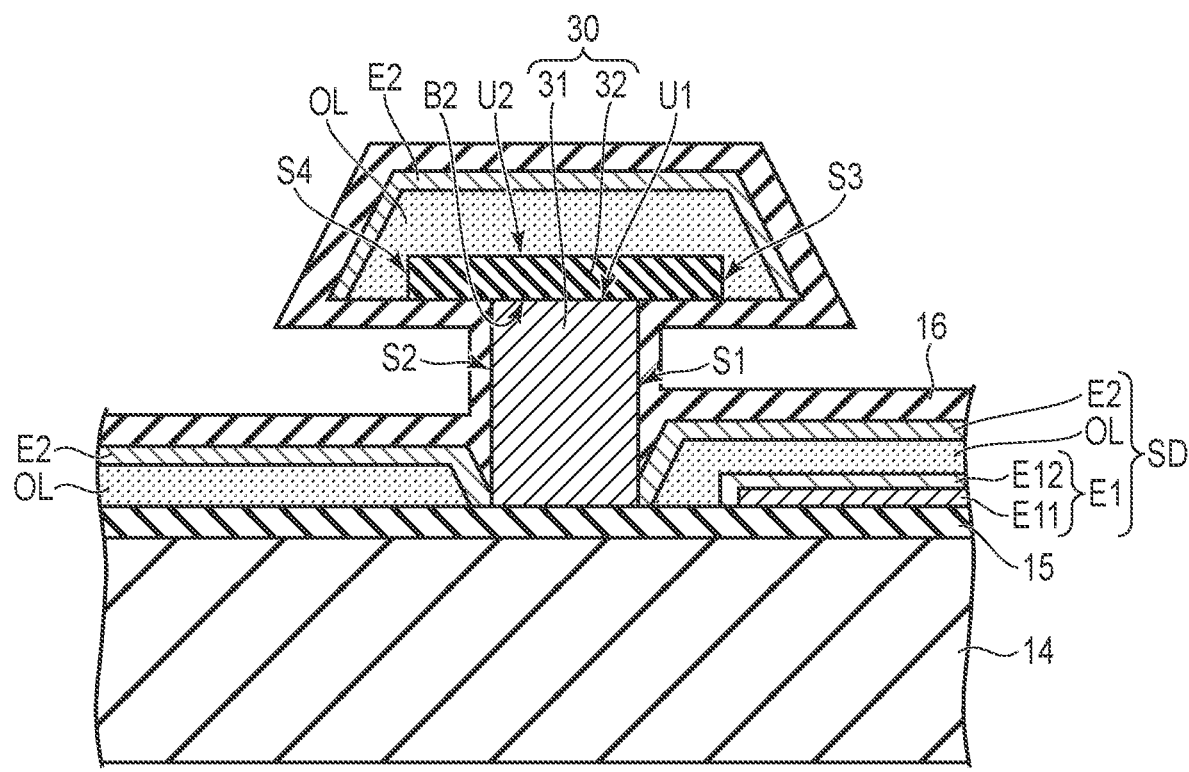
FIG. 7 is an enlarged cross-sectional view showing a configuration example of the barrier wall 30.

FIG. 7 is an enlarged cross-sectional view showing a configuration example of the barrier wall 30. Illustration of a range from the insulating base 10 to the inorganic insulating film 13 is omitted.

As described above, the barrier wall 30 comprises the first layer 31 and the second layer 32. The first layer 31 has the first side surface S1 facing the electrical element SD, the second side surface S2 on the side opposite to the first side surface S1, and the first upper surface U1 between the first side surface S1 and the second side surface S2. The first side surface S1 corresponds to an inner surface of the barrier wall 30 which surrounds the electrical element SD, and the second side surface S2 corresponds to an outer surface of the barrier wall 30.

The second layer 32 has the bottom surface B2 which is in contact with the first upper surface U1, the third side surface S3 facing the electrical element SD, the fourth side surface S4 on a side opposite to the third side surface S3, and the second upper surface U2 between the third side surface S3 and the fourth side surface S4. The bottom surface B2 extends from the first side surface S1 toward the electrical element SD and extends from the second side surface S2 toward the outside (i.e., a side opposite to the electrical element SD). In other words, the second layer 32 extends from the first side surface S1 toward the electrical element SD, and further extends from the second side surface S2 to the side opposite to the electrical element SD.

The organic layer OL and the second electrode E2 are stacked on the second layer 32, and are separated from the organic layer OL and the second electrode E2 that constitute the electrical element SD.

In the example shown in FIG. 7, the third side surface S3, the fourth side surface S4, and the second upper surface U2 of the second layer 32 are in contact with the organic layer OL, and the bottom surface B2 between the first side surface S1 and the third side surface S3, and the bottom surface B2 between the second side surface S2 and the fourth side surface S4 are exposed from the organic layer OL and the second electrode E2.

Such a barrier wall 30 separates the organic layer OL and the upper electrode E2 that constitute the electrical device SD from the organic layer OL and the upper electrode E2 located outside the electrical element SD. However, the upper electrode E2 is in contact with the first side surface S1 and the second side surface S2 of the first layer 31 which is a conductive layer. Thus, an inner area surrounded by the barrier wall 30 and an outer area of the upper electrode E2 are divided, but are electrically connected to each other via the barrier wall 30 (or the first layer 31).

The sealing film 16 is in contact with the first side surface S1 and the second side surface S2 of the first layer 31. In addition, the sealing film 16 is in contact with the bottom surface B2 between the first side surface S1 and the third side surface S3 and between the second side surface S2 and the fourth side surface S4, in the second layer 32.

As described above, the organic layer OL and the upper electrode E2 of the electrical element SD disposed at the island-shaped portion I are separated from the organic layer OL and the upper electrode E2 disposed at each of the strip-shaped portions BX and BY, by the barrier wall 30. For this reason, even if cracks occur at the sealing film 16 which is an inorganic film or the upper electrode E2 in accordance with the deformation of the strip-shaped portions BX and BY having elasticity, propagation of the cracks to the island-shaped portion I is suppressed. For this reason, occurrence of the cracks at the sealing film 16 covering the electrical element SD, peeling of the sealing film 16 from the upper electrode E2 and further peeling of the upper electrode E2 from the organic layer OL, are suppressed.

In addition, even if moisture penetrates through the cracks generated at the strip-shaped portions BX and BY, the moisture penetration path toward the electrical element SD is blocked by the barrier wall 30, and degradation of the electrical element SD due to moisture is thereby suppressed.

Therefore, the degradation of the electric element SD due to outside air and moisture is suppressed. For this reason, the reduction in reliability can be suppressed.

Next, a method of manufacturing the above-described flexible substrate 2 will be described with reference to FIG.

Figure 9:
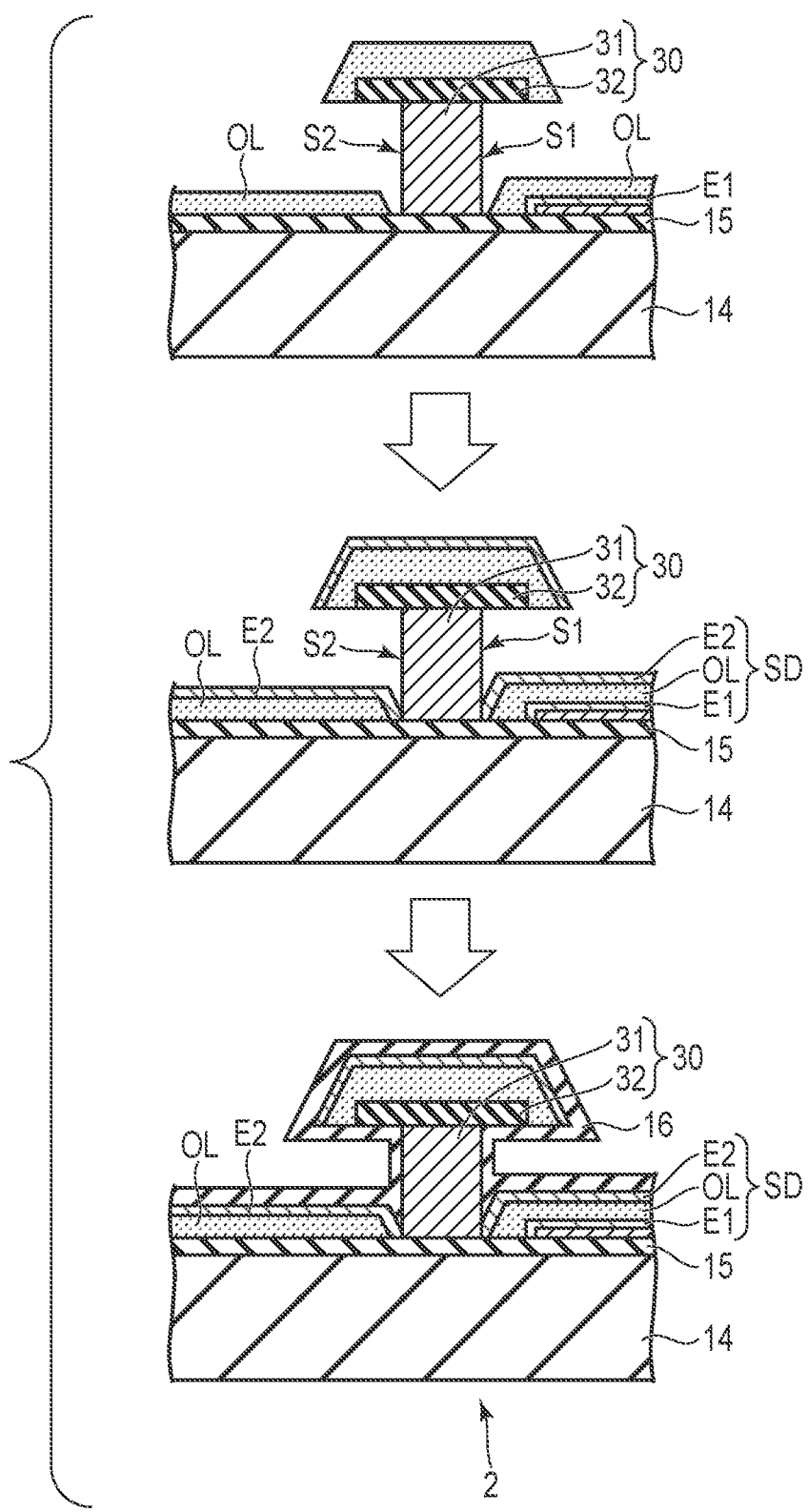
FIG. 9 is a view illustrating the method of manufacturing the flexible substrate 2.

8 and FIG. 9. Illustration of a range from the insulating base 10 to the inorganic insulating film 13 is omitted in each of the figures.

First, for example, after the inorganic insulating film 11 is formed on the insulating base 10 formed of polyimide, the wiring layer 21, the inorganic insulating film 12, the wiring layer 22, the inorganic insulating film 13, the organic insulating film 14, and the inorganic insulating film 15 are formed sequentially.

Figure 8:
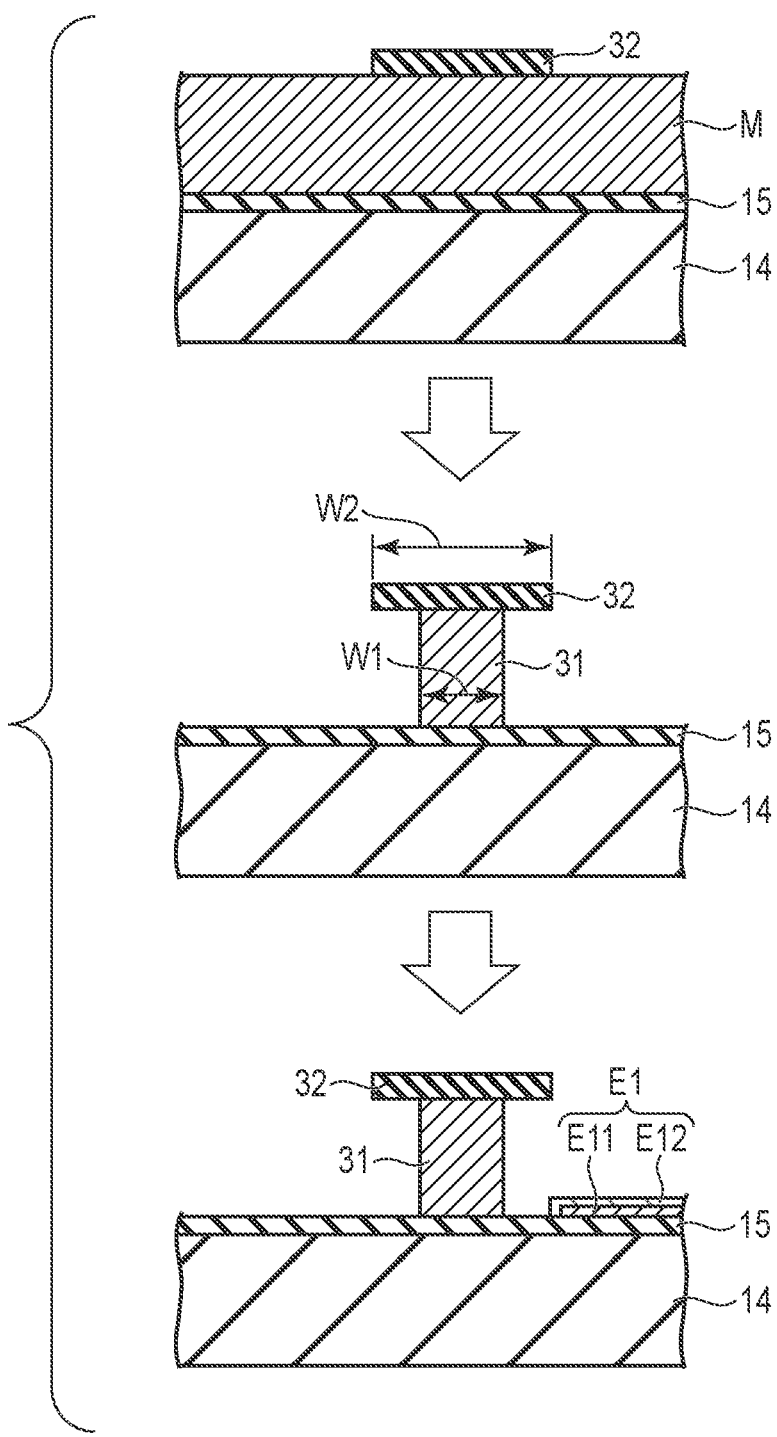
FIG. 8 is a view illustrating a method of manufacturing the flexible substrate 2.

Then, as shown in the upper stage of FIG. 8, after a metal layer M is formed on the inorganic insulating film 15, an insulating layer of, for example, aluminum oxide is formed and the insulating layer is patterned into a predetermined shape to form the second layer 32.

Then, as shown in the middle stage, the first layer 31 is formed by etching the metal layer M using the second layer 32 as a mask. In the etching, a resist may be provided to protect the second layer 32. At this time, etching is performed under the condition that a width W1 of the first layer 31 is smaller than a width W2 of the second layer 32.

Then, as shown in the lower stage, after a metal layer E11 is formed on the inorganic insulating film 15 as the lower electrode E1, the transparent conductive layer E12 is formed to cover the metal layer E11. The inorganic insulating film 15 is exposed between the lower electrode E1 and the first layer 31.

Then, as shown in the upper stage in FIG. 9, the organic layer OL is formed by, for example, vacuum deposition. At this time, vapor from the evaporation source reaches the upper surface of the lower electrode E1 and the inorganic insulating film 15 through the area where the barrier wall 30 does not exist. The vapor from the evaporation source does not reach the area in the shadow of the second layer 32 of the barrier wall 30 (the first side surface S1 and the second side surface S2 of the first layer 31).

Then, the upper electrode E2 is formed by, for example, sputtering, as shown in the middle stage. At this time, the vapor from the evaporation source reaches the upper surface of the organic layer OL, as well as the first side surface S1 and the second side surface S2 of the first layer 31, through the area where the barrier wall 30 does not exist.

Then, as shown in the lower stage, for example, the sealing film 16 of aluminum oxide is formed by vapor deposition. The sealing film 16 is formed to cover the electrical element SD and the barrier wall 30. The flexible substrate 2 is thereby manufactured.

As described above, the organic layer OL and the upper electrode E2 of the electrical element SD are formed without applying a fine mask. For this reason, the manufacturing costs can be reduced, processes such as positioning a fine mask are not required, and the organic layer OL and the upper electrode E2 in a desired shape can easily be formed, as compared with a case where a fine mask is applied.

Next, another configuration example of the barrier wall 30 will be described.

Figure 10:
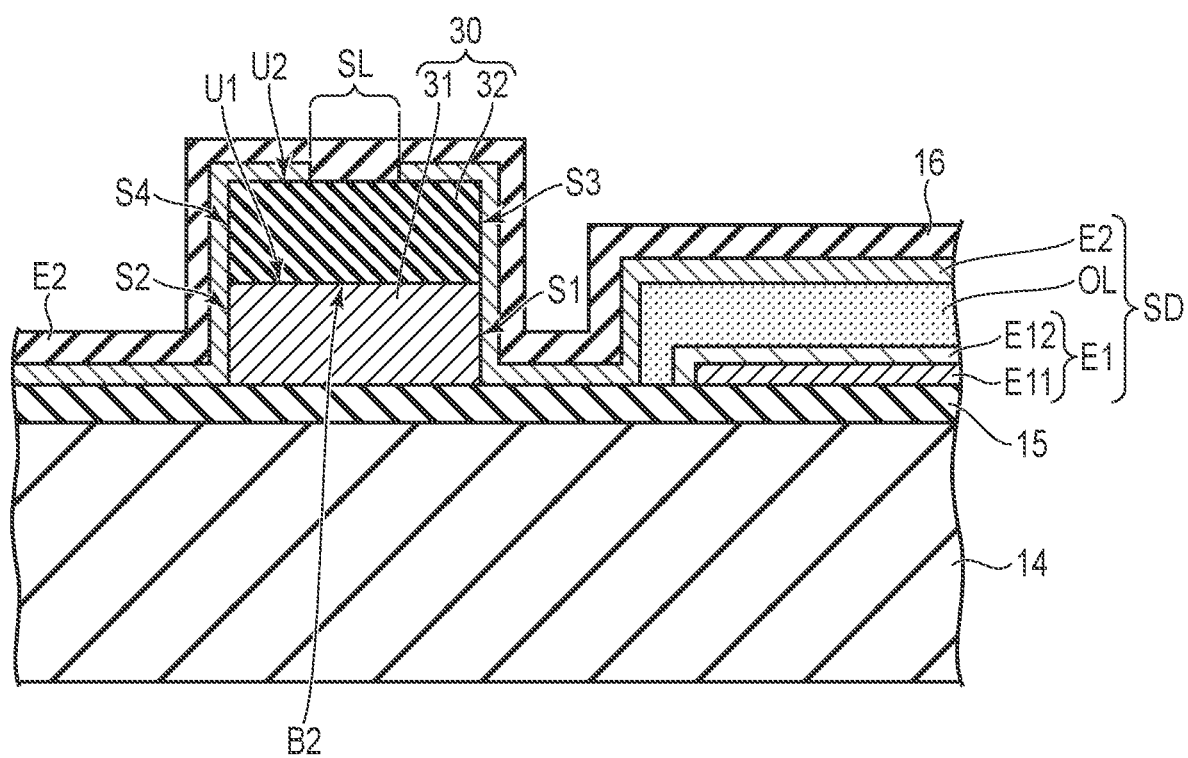
FIG. 10 is an enlarged cross-sectional view showing another configuration example of the barrier wall 30.

FIG. 10 is an enlarged cross-sectional view showing another configuration example of the barrier wall 30. Illustration of a range from the insulating base 10 to the inorganic insulating film 13 is omitted.

The first layer 31 has the first side surface S1 facing the electrical element SD, the second side surface S2 on the side opposite to the first side surface S1, and the first upper surface U1 between the first side surface S1 and the second side surface S2.

The second layer 32 has the bottom surface B2 which is in contact with the first upper surface U1, the third side surface S3 facing the electrical element SD, the fourth side surface S4 on a side opposite to the third side surface S3, and the second upper surface U2 between the third side surface S3 and the fourth side surface S4. The third side surface S3 and the fourth side surface S4 overlap the first upper surface U1. In other words, the second layer 32 does not extend from the first side surface S1 toward the electrical element SD or does not extend from the second side surface S2 toward the side opposite to the electrical element SD. In the example shown in FIG. 10, the third side surface S3 overlaps the first side surface S1, and the fourth side surface S4 overlaps the second side surface S2. In the barrier wall 30, the first side surface S1 and the third side surface S3 correspond to the inner surface surrounding the electrical elements SD, and the second side surface S2 and the fourth side surface S4 correspond to the outer surface.

The electrical element SD comprises the lower electrode E1, the organic layer OL, and the upper electrode E2. The lower electrode E1 and the organic layer OL are separated from the barrier wall 30. The upper electrode E2 is in contact with the inorganic insulating film 15 between the barrier wall 30 and the organic layer OL. In addition, the upper electrode E2 is in contact with the first side surface S1 and the third side surface S3, and a part of the upper electrode E2 is disposed on the second upper surface U2.

The organic layer OL is not disposed outside the barrier wall 30. In other words, the upper electrode E2 is in contact with the inorganic insulating film 15 without the organic layer OL interposed therebetween, outside the barrier wall. In addition, the upper electrode E2 is in contact with the second side surface S2 and the fourth side surface S4. The upper electrode E2 includes a slit SL on the second upper surface U2. The slit SL is formed in a shape similar to the barrier wall 30 as shown in, for example, FIG. 3 in planar view to surround the electrical element SD.

The sealing film 16 covers the upper electrode E2. In addition, the sealing film 16 is in contact with the second upper surface U2 of the second layer 32 in the slit SL.

Next, a method of manufacturing the above-described flexible substrate 2 will be described with reference to FIG. 11 and FIG. 12. Illustration of a range from the insulating base 10 to the inorganic insulating film 13 is omitted in each of the figures.

First, for example, after the inorganic insulating film 11 is formed on the insulating base 10 formed of polyimide, the wiring layer 21, the inorganic insulating film 12, the wiring layer 22, the inorganic insulating film 13, the organic insulating film 14, and the inorganic insulating film 15 are formed sequentially.

Figure 11:
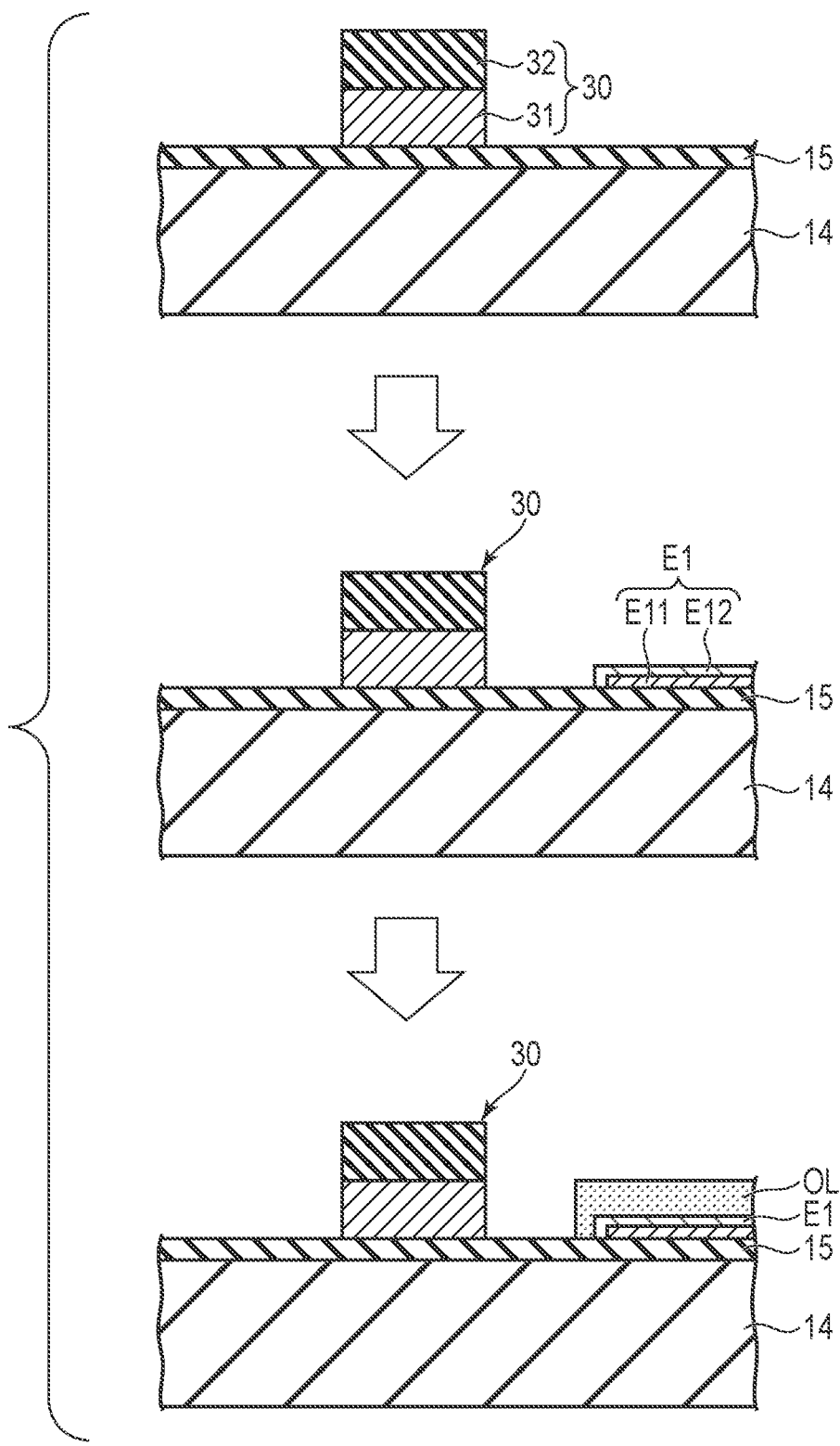
FIG. 11 is a view illustrating another method of manufacturing the flexible substrate 2.

Then, as shown in the upper stage in FIG. 11, the barrier wall 30 in which the first layer 31 and the second layer 32 are stacked is formed on the inorganic insulating film 15. The first layer 31 is formed by patterning a metal layer, and the second layer 32 is formed by patterning an insulating layer, but patterning the metal layers and insulating layers may be performed together or separately.

After that, as shown in the middle stage, the metal layer E11 is formed as the lower electrode E1 on the inorganic insulating film 15, and the transparent conductive layer E12 is formed to cover the metal layer E11. The inorganic insulating film 15 is exposed between the lower electrode E1 and the barrier wall 30.

Then, as shown in the lower stage, the organic layer OL is formed by, for example, vacuum deposition. At this time, a mask having an opening is applied such that the vapor from the evaporation source reaches the desired area. Thus, the vapor to form the organic layer OL reaches the upper surface of the lower electrode E1, but does not reach the barrier wall 30 or the area outside the barrier wall 30.

Figure 12:
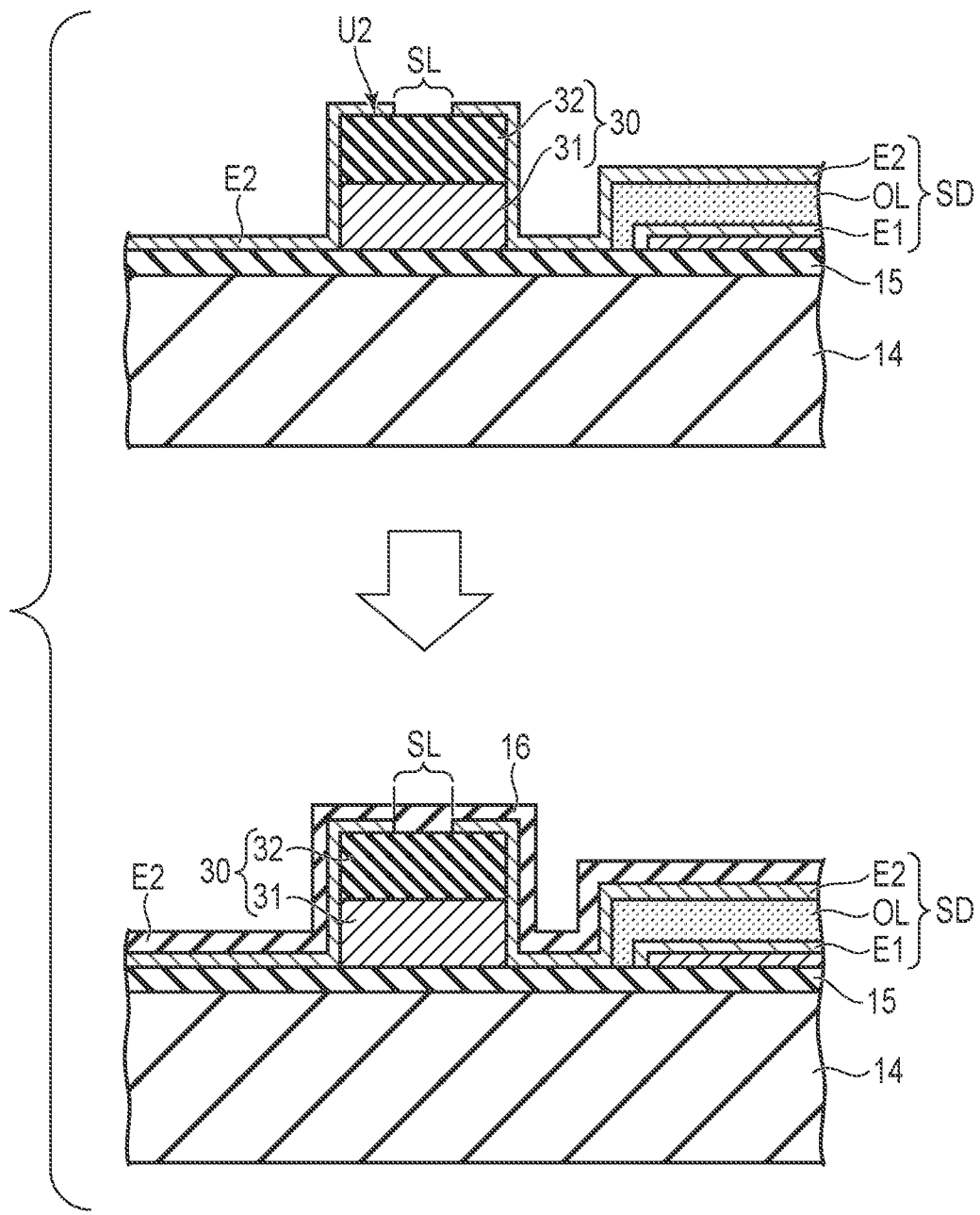
FIG. 12 is a view illustrating the other method of manufacturing the flexible substrate 2.

Then, as shown in the upper stage in FIG. 12, the upper electrode E2 is formed by, for example, sputtering. At this time, the vapor from the evaporation source reaches almost the entire surface of the organic layer OL, the inorganic insulating film 15, and the barrier wall 30. Then, the upper electrode E2 covering the second upper surface U2 is partially removed to form the slit SL.

Then, as shown in the lower stage, the sealing film 16 which covers the upper electrode E2 and is in contact with the second layer 32 in the slit SL is formed by vapor deposition, and the flexible substrate 2 is thereby manufactured.

In the other configuration example, too, the upper electrode E2 of the electrical element SD disposed in the island-shaped portion I is separated from the upper electrode E2 disposed in each of the strip-shaped portions BX and BY, by the barrier wall 30. For this reason, even if cracks occur at the sealing film 16 which is an inorganic film or the upper electrode E2 in accordance with the deformation of the strip-shaped portions BX and BY having elasticity, propagation of the cracks to the island-shaped portion I is suppressed. For this reason, the same advantages as those described above can be obtained.

As described above, the electronic device capable of suppressing the reduction in reliability can be provided according to the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the inventions.

What is claimed is:

1. An electronic device comprising:
   an insulating base including a strip-shaped portion having elasticity and an island-shaped portion connected to the strip-shaped portion;
   an organic insulating film disposed on the insulating base;
   an inorganic insulating film disposed on the organic insulating film;
   a wiring disposed between the strip-shaped portion and the organic insulating film;
   an electrical element disposed on the inorganic insulating film and electrically connected to the wiring, in the island-shaped portion;
   a barrier wall overlapping the island-shaped portion and the strip-shaped portion and surrounding the electrical element; and
   a sealing film covering the electrical element, wherein
   the barrier wall comprises:
      a first layer which is in contact with the inorganic insulating film; and
      a second layer formed of an inorganic insulating material which is the same as a material of the sealing film, and stacked on the first layer,
   the second layer is in contact with the sealing film,
   the first layer includes a first side surface facing the electrical element, a second side surface on a side opposite to the first side surface, and a first upper surface,
   the second layer includes a bottom surface which is in contact with the first upper surface,
   the bottom surface extends from the first side surface toward the electrical element and extends from the second side surface toward an outside, and
   the sealing film is in contact with the first side surface, the second side surface, and the bottom surface.

2. The electronic device of claim 1, wherein
   the first layer is formed of a metal material,
   the electrical element comprises:
      a lower electrode disposed on the inorganic insulating film;
      an organic layer disposed on the lower electrode; and
      an upper electrode disposed on the organic layer,
   the lower electrode is separated from the barrier wall, and
   the upper electrode is in contact with the first side surface of the first layer.

3. The electronic device of claim 1, wherein
   all of the inorganic insulating film, the second layer, and the sealing film are formed of silicon nitride or aluminum oxide.

4. The electronic device of claim 1, wherein
   the electrical element is a light emitting element or a sensor.

5. The electronic device of claim 1, wherein
   the strip-shaped portion meanders.

6. An electronic device comprising:
   an insulating base including a strip-shaped portion having elasticity and an island-shaped portion connected to the strip-shaped portion;
   an organic insulating film disposed on the insulating base;
   an inorganic insulating film disposed on the organic insulating film;
   a wiring disposed between the strip-shaped portion and the organic insulating film;
   an electrical element disposed on the inorganic insulating film and electrically connected to the wiring, in the island-shaped portion;
   a barrier wall overlapping the island-shaped portion and the strip-shaped portion and surrounding the electrical element; and
   a sealing film covering the electrical element, wherein
   the barrier wall comprises:
      a first layer which is in contact with the inorganic insulating film; and
      a second layer formed of an inorganic insulating material which is the same as a material of the sealing film, and stacked on the first layer,
   the second layer is in contact with the sealing film,
   the first layer includes a first side surface facing the electrical element, a second side surface on a side opposite to the first side surface, and a first upper surface,
   the second layer includes a bottom surface which is in contact with the first upper surface, a third side surface facing the electrical element, a fourth side surface on a side opposite to the third side surface, and a second upper surface,
   the third side surface and the fourth side surface overlap the first upper surface,
   the sealing film is in contact with the second upper surface,
   the first layer is formed of a metal material,
   the electrical element comprises:
      a lower electrode disposed on the inorganic insulating film;
      an organic layer disposed on the lower electrode; and an upper electrode disposed on the organic layer,
the lower electrode is separated from the barrier wall, and
the upper electrode is in contact with the first side surface of the first layer and the third side surface of the second layer.

7. The electronic device of claim 6, wherein
all of the inorganic insulating film, the second layer, and the sealing film are formed of silicon nitride or aluminum oxide.

8. The electronic device of claim 6, wherein
the electrical element is a light emitting element or a sensor.

9. The electronic device of claim 6, wherein
the strip-shaped portion meanders.

* * * * *